(12) United States Patent
Barthelet et al.

(10) Patent No.: US 7,439,955 B2
(45) Date of Patent: Oct. 21, 2008

(54) INPUT KEYBOARD WITH INCREASED NUMBER OF KEYS FOR AN ELECTRONIC DEVICE WITH A LIMITED NUMBER OF CONNECTING PINS

(75) Inventors: Philippe Barthelet, Bois-Colombes (FR); Eric Dalla Ricca, Colombes Cedex (FR); Pascal Vetu, Colombes Cedex (FR)

(73) Assignee: TCL & Alcatel Mobile Phones Limited, Hong Kong (CN)

( * ) Notice: Subject to any disclaimer, the term of this patent is extended or adjusted under 35 U.S.C. 154(b) by 617 days.

(21) Appl. No.: 11/175,011

(22) Filed: Jul. 5, 2005

(65) Prior Publication Data

US 2006/0066577 A1    Mar. 30, 2006

(30) Foreign Application Priority Data

Jul. 9, 2004    (FR) .................................. 04 51483

(51) Int. Cl.
G09G 5/00    (2006.01)
(52) U.S. Cl. ........................... 345/168; 200/342; 341/22
(58) Field of Classification Search ................. 345/168, 345/169, 173; 178/18.01; 341/22; 400/489, 400/490, 495; 235/145 R; 200/517, 314, 200/329, 302.2, 341, 342, 510

See application file for complete search history.

(56) References Cited

U.S. PATENT DOCUMENTS 4,395,704 A    7/1983    Kishimoto .................. 340/365
4,408,184 A    10/1983   Ishii ........................... 340/365
7,123,241 B2 *  10/2006   Bathiche ..................... 345/168
2002/0167494 A1  11/2002   Sherman ..................... 345/168

OTHER PUBLICATIONS

French Search Report- Mar. 11, 2005.

* cited by examiner

*Primary Examiner*—Abbas I Abdulselam
(74) *Attorney, Agent, or Firm*—Morgan, Lewis & Bockius LLP

(57) ABSTRACT

An electronic device includes a microprocessor connected to an input keyboard comprising primary conductive lines connected to primary areas and to a terminal. It further includes first, second and third secondary conductive lines connected to secondary areas and to a terminal. It further includes input keys each of which, when operated, establishes contact between a primary area of a primary line and a secondary area of a secondary line to place each of these two lines in a high state. It further includes first and second processors each having a first input connected to the terminal of the first or second secondary line, a second input connected to the terminal of the third secondary line, and an output that is either in the same state as the first or second secondary line to which it is connected if the third secondary line is not in its high state, or in the high state if the third secondary line is in its high state, and is connected, like each primary line terminal, to the microprocessor so that it can determine each key operated as a function of the respective states of the primary lines and the outputs of the first and second processing means.

13 Claims, 2 Drawing Sheets

INPUT KEYBOARD WITH INCREASED NUMBER OF KEYS FOR AN ELECTRONIC DEVICE WITH A LIMITED NUMBER OF CONNECTING PINS

RELATED APPLICATION

This application is related to and claims the benefit of priority from French Patent Application No. 04 51 483, filed on Jul. 9, 2004, the entirety of which is incorporated herein by reference.

BACKGROUND OF THE INVENTION

1. Field of the Invention

The field of the invention is that of input keyboards.

2. Description of the Prior Art

Many electronic devices include a microprocessor connected to a keyboard with input keys enabling their users to send them instructions or commands. For example, certain keys may be dedicated to entering a letter of an alphabet and/or a digit and/or a punctuation mark, while other keys may be dedicated to movement in selected directions (and are then referred to as "navigation" keys).

In the present context, the expression "electronic device" means any device equipped with a man/machine interface for input of information or commands, for example a fixed or portable computer (where applicable of the onboard type), a fixed or mobile telephone, a personal digital assistant (PDA), a guidance or navigation device, or a video games console.

For the microprocessor to be able to determine (or recognize) an input key that has just been actuated, it has a certain number of connecting pins to which are connected, for example via a bus, connecting terminals that are themselves connected to conductive lines connected to the various keys.

Because the microprocessor has a limited number of connecting pins, there has previously been proposed a keyboard using a "grid" connection architecture. To be more precise, this type of keyboard comprises: i) primary and secondary conductive lines connected to respective primary and secondary connecting areas and to a connecting terminal intended to be connected to a device microprocessor, and ii) input keys each of which can establish, when operated, contact between one of the primary areas of one of the primary lines and one of the secondary areas of one of the secondary lines so as to place these primary and secondary lines in a "high" logic state (for example a logic state equal to 1). If the microprocessor detects high states on two of its connecting pins, it merely has to access a table establishing a correspondence between key identifiers, primary line identifiers and secondary line identifiers to determine the identifier of the operated key that caused the connecting terminals connected to the two connecting pins to be placed in the high state.

For example, the microprocessor detects a short circuit between a secondary line (for example a secondary line serving as an input line) and a primary line (for example a primary line serving as an output line) brought about by establishing contact between a primary area of that primary line and a secondary area of that secondary line by means of a key. Other types of detection may be envisaged, of course, provided that they are based on the absence or the presence of an analog "signal" (for example an electrical potential) or a digital "signal".

Thanks to the grid (or matrix) architecture described above, the maximum number K of keys that can be managed by a microprocessor with P connecting pins is equal to the product of the number N of primary connecting lines by the number M of secondary connecting lines ($K=N\times M$), with the constraint that $P=N+M$. For example, a microprocessor with $P=10$ connecting pins can manage at most $K=25$ keys (when $N=M=5$).

The number of input keys of the keyboard of certain devices cannot be increased because the number of connecting pins of their microprocessor cannot be increased, so that adding functions or commands necessitates configuring the microprocessor so that it can associate each function or command that is added with operation of at least two keys, for example.

For example, if the keyboard includes four navigation keys associated with four "main" directions of movement (north, south, east and west) and there is a requirement to define "intermediate" directions of movement (north-east, north-west, south-east and south-west), the microprocessor must be configured so that it associates each intermediate direction with the successive operation of the two navigation keys that are associated with the combination of main directions that define it. For example, if the device has a navigation function coupled to a joystick and the user orients his joystick in the north-east direction, the joystick must operate the underlying north and east keys within a predefined time period for the microprocessor to interpret this as a double keystroke and to understand that it is the north-east direction that is being requested.

The direction in which the joystick is pointed does not always correspond to the theoretical direction in which said joystick is able to press on the two keys concerned within the time period allowed. Consequently, if the joystick presses on only one of the two keys, the microprocessor understands that the direction requested is that which corresponds to the activated key, which is an error.

Furthermore, this two-fold operation may prove to be incompatible with certain uses requiring fast input of commands, as in certain video games, for example.

The invention therefore proposes to improve on the above situation.

SUMMARY OF THE INVENTION

To this end it proposes an input keyboard for an electronic device including a microprocessor having a limited number of connecting pins, of the type comprising:

i) at least two primary conductive lines each connected to at least one primary connecting area and to one connecting terminal, each connecting terminal being adapted to be connected directly to a connecting pin of said microprocessor, ii) at least one first secondary conductive line, one second secondary conductive line and one third secondary conductive line each connected to at least one secondary connecting area and to one connecting terminal, iii) at least three input keys each adapted, when operated, to establish contact between a primary area of one of the primary lines and a secondary area of one of the secondary lines so that each of the primary and secondary lines is placed in a "high" state at its connecting terminal, characterized in that it further comprises at least first processing means and second processing means each including at least:

one first input connected to the connecting terminal of the first secondary line or the second secondary line, respectively, one second input connected to the connecting terminal of the third secondary line, and one output adapted to be placed either in the same state as the first secondary line or the second secondary line, respectively, to which it is connected if the third secondary line is not in its high state, or in the high state if the third secondary line is in its high state, each output being adapted to be connected to one of the connecting pins of the microprocessor so that it can determine each key operated as a function of the respective states of, firstly, the primary lines and, secondly, the outputs of the first processing means and the second processing means.

The invention applies to any type of detection provided that it relates to the absence (for example a low state) or the presence (for example a high state) of an analog signal (such as an electrical potential) or a digital signal.

The keyboard of the invention may have additional features, and in particular the following additional features, either separately or in combination:

its first processing means and its second processing means may each take the form of a multiplexer having a second input that is a command input and a third input that is permanently at a high state and is adapted to be connected to the output if the third secondary line is in its high state, the first input being coupled to the output if the third secondary line is not in its high state, at least four primary conductive lines each connected to a selected number of primary connecting areas and to a connecting terminal adapted to be connected to the microprocessor and at least one fourth secondary conductive line, one fifth secondary conductive line and one sixth secondary conductive line each connected to a selected number of secondary connecting areas and to a connecting terminal adapted to be connected to the microprocessor. In this case, each primary line is connected, for example, to at least six primary areas associated with six input keys and each of the secondary lines is connected to at least four secondary areas. The first secondary line and two of the primary lines may be associated with two "navigation" keys themselves associated with two "main" directions and the second secondary line and two other primary lines may be associated with two other navigation keys, themselves associated with two other main directions. The third secondary line and four of the primary lines may be associated with four other navigation keys themselves associated with four "intermediate" directions respectively consisting of different pairs of main directions, at least one of the primary lines may be connected to at least one additional primary area associated with an additional input key. In this case the keyboard comprises:

at least one seventh secondary line connected to at least one additional secondary area associated with the additional key and with a connecting terminal, and third processing means and fourth processing means each comprising: i) at least one first input connected to the connecting terminal of the fourth secondary line or the fifth secondary line, ii) one second input connected to the connecting terminal of the seventh secondary line, and iii) one output adapted to be placed either in the same state as the fourth secondary line or the fifth secondary line to which it is connected if the seventh secondary line is not in its high state or in the high state if the seventh secondary line is in its high state and adapted to be connected to the microprocessor so that it can determine each key operated associated with the seventh secondary line as a function of the respective states of the primary lines and the outputs of the third processing means and the fourth processing means. The third processing means and the fourth processing means may each take the form of a multiplexer having a second input that is a command input and a third input that is permanently in a high state and is adapted to be connected to the output if the seventh secondary line is in its high state, the first input being coupled to the output if the seventh secondary line is not in its high state, at least one additional primary line connected to at least three primary areas associated with three other input keys and with three secondary areas connected to the fourth, fifth and sixth secondary conductive lines.

The invention also proposes an electronic device comprising at least one microprocessor connected to an input keyboard of the type defined above.

The device preferably comprises analysis means adapted to analyze the states of the primary lines and the outputs of the first processing means and/or the second processing means of the keyboard and to deduce that an operated key is associated either with the first secondary line, respectively the second secondary line, if a primary line is in its high state and the output of the first processing means, respectively second processing means, is in its high state, or to the third secondary line if a primary line is in its high state and the outputs of the first processing means and the second processing means are in their high state.

The device may also comprise storage means adapted to store a table establishing a correspondence between key identifiers, primary line identifiers and secondary line identifiers. In this case the analysis means are adapted to access the storage means to determine in the table a key identifier corresponding to analyzed line states.

The device may be, for example, a fixed or portable computer (possibly of the onboard type), a fixed or mobile telephone, a personal digital assistant, a guidance or navigation device or a video games console. The invention relates generally to any device having an input keyboard.

Other features and advantages of the invention will become apparent on reading the following detailed description and examining the appended drawings.

DETAILED DESCRIPTION OF THE PREFERRED EMBODIMENTS

The appended drawings constitute part of the description of the invention as well as, if necessary, contributing to the definition of the invention.

An object of the invention is to enable one or more input keys to be added to a keyboard connected to an electronic device microprocessor having a number of fixing pins that cannot be increased.

Figure 1:
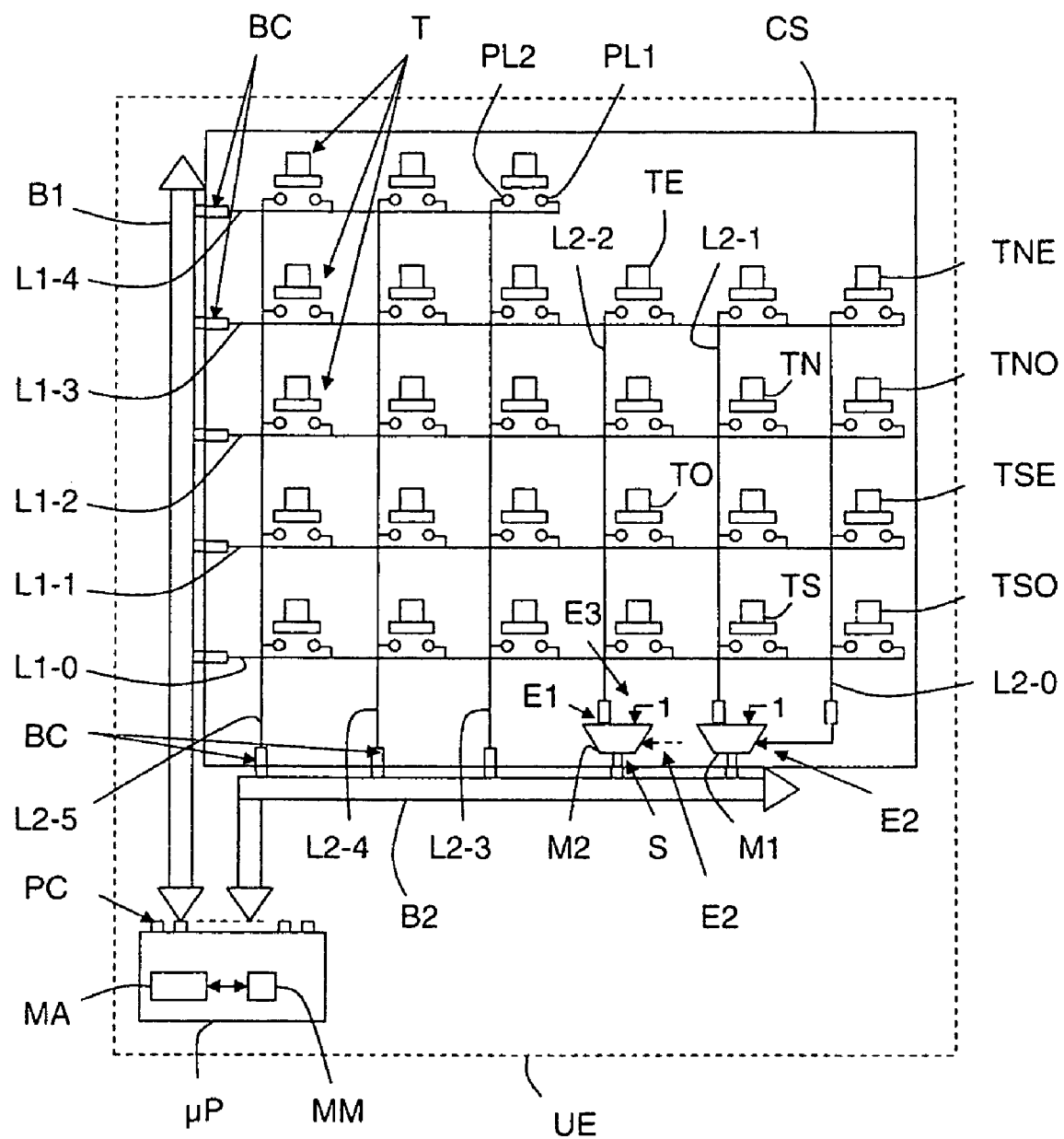
FIG. 1 is a diagram of a first embodiment of an input keyboard of the invention connected to an electronic device microprocessor.

A first nonlimiting embodiment of an input keyboard CS of the invention is described first with reference to FIG. 1.

Hereinafter it is considered that the input keyboard CS is connected to a microprocessor µP of a mobile telephone UE. However, the invention applies to any type of electronic device having a man/machine interface for input of information or commands, for example a fixed or portable computer (possibly of the onboard type), a fixed telephone, a PDA, a guidance or navigation device, or a video games console.

The keyboard CS shown in FIG. 1 comprises five primary conductive lines L1-$i$ ($i$=0 to 4) and six secondary conductive lines L2-$j$ ($j$=0 to 5). In the present context, the expression "conductive connecting line" means either a printed circuit (flexible or rigid) or a conductive wire.

Each primary line L1-$i$ is connected to a connecting terminal BC and to at least three primary connecting areas PL1 each associated with an input key T. To be more precise, in the present example, the first four primary lines L1-0 to L1-3 are each connected to six primary connecting areas PL1 (and therefore associated with six keys T) and the fifth primary line L1-4 is connected to only three primary connecting areas PL1 (and therefore associated with three keys T).

The connecting terminal BC of each primary line L1-$i$ is connected to one of the connecting pins PC of the microprocessor μP. In the present example this connection is effected through the intermediary of a first parallel bus B1. However, other types of connection may be envisaged, for example by means of printed circuits or conductive wires.

Each secondary line L2-$j$ is also connected to a connecting terminal BC and to at least four secondary connecting areas PL2 each associated with one of the input keys T. To be more precise, in the present example, the first three secondary lines L2-0 to L2-2 are each connected to four secondary connecting areas PL2 (and therefore associated with four keys T) and the fourth secondary line L2-3, the fifth secondary line L2-4 and the sixth secondary line L2-5 are connected to five secondary connecting areas PL2 (and therefore associated with five keys T).

Each input key T is an actuator, for example, for establishing electrical contact, when a user depresses it briefly, between the primary area PL1 and the secondary area PL2 with which it is associated. For example, this brief contact causes a momentary short circuit between the primary line L1-$i$ (serving as an output line, for example) and the secondary line L2-$j$ (serving as an input line, for example) to which the contacted primary area PL1 and secondary area PL2 are respectively connected.

When a primary or secondary line is short circuited in this way, it is said to be in a "high" logic state (for example corresponding to a binary value equal to 1). Accordingly, if the microprocessor μP detects a short circuit on two of its connecting pins PC respectively associated with a primary line and a secondary line, it knows immediately that the key placed at the intersection of those primary and secondary lines has been operated.

In the absence of detection of a short circuit on connecting pins PC respectively associated with a primary line and a secondary line, each of these primary and secondary lines is said to be in a "low" logic state (for example corresponding to a binary value equal to 0). In other words, no key associated with these two lines has been operated.

Of course, other types of detection may be envisaged, provided that they are based on the absence (a low state) or the presence (a high state) of an analog or digital signal.

According to the invention, at least two of the secondary lines L2-$j$ (in this example the secondary lines L2-1 and L2-2) are connected by their connecting terminals BC to a first input E1 of processing means M$j$ ($j$=1 or 2) and at least one of them (in the present example the secondary line L2-0) is connected by its connecting terminal BC to a second input E2 of the processing means M$j$.

The processing means M$j$ are preferably multiplexers having three inputs (the first input E1 referred to above (connected to the connecting terminal BC of one of the two secondary lines L2-1 and L2-2), the second input E2 referred to above serving as a command input (connected to the connecting terminal BC of the secondary line L2-0), and a third input E3 defining a high state (the value 1 in the present example)), and an output S.

The second input E2 commands the input (either the input E1 or the input E3) to be connected to the output S as a function of the state of the secondary line L2-0 to which it is connected.

According to the invention, if the secondary line L2-0 is in its high state (in the present example equal to 1), then the output S of each multiplexer M1, M2 is connected to the corresponding third input E3, whereas if the secondary line L2-0 is in its low state (in the present example equal to 0), then the output S of each multiplexer M1, M2 is connected to the corresponding first input E1.

In other words, if no key T associated with the secondary line L2-0 is activated, the line is in its low state with the result that the second input E2 obliges each multiplexer M1, M2 to connect its first input E1 to its output S. Consequently, if a key T associated with the secondary line L2-1 or L2-2 is operated, the latter goes to its high state and the output S of its multiplexer M1 or M2 "delivers" (for example over a second bus B2 connected to connecting pins PC of the microprocessor μP), a signal representative of the high state which, when it reaches the connecting pin PC of the microprocessor μP, advises the latter of the operation of a key T of the secondary line L2-1 or L2-2. At the same time, operating the key T causes the primary line L1-$i$ with which it is also associated (via the contacted primary area PL1) to go to the high state. A signal representative of the high state of the primary line concerned then "penetrates" the first bus B1, and when that signal reaches the connecting pin PC of the microprocessor μP, the latter is advised of the operation of one of the keys T of the primary line L1-$i$.

In the case of short circuit detection, the signals representative of a high state are identical electrical potentials. In other words, the short circuit places the two connecting pins concerned at the same electrical potential.

To identify precisely which key T has been operated, the microprocessor μP preferably includes an analysis module MA and a table establishing the correspondence between the identifiers of the keys T, the identifiers of the primary lines L1-$i$, and the identifiers of the secondary lines L2-$j$. If the microprocessor μP receives on two of its connecting pins PC a high signal (for example identical electrical potentials), it advises its analysis module MA of this, and the latter module deduces the identifiers of the primary and secondary lines that generated the high signals, after which it accesses the memory MM to determine in the table therein the key identifier that is stored in corresponding relationship to the primary and secondary line identifiers. The operated key is thus identified and the associated command or function can be executed.

If one of the keys T associated with the secondary line L2-0 is now operated, the latter goes to its high state with the result that the second input E2 obliges each multiplexer M1, M2 to connect its third input E3 to the output S. The output S of each multiplexer M1, M2 then "delivers" over the second bus B2 a signal representative of a high state. The two high signals then reach two connecting pins PC of the microprocessor μP (corresponding to the secondary lines L1-1 and L1-2) at substantially the same time. At the same time as this, operation of the key T places the primary line L1-$i$ with which it is also associated in the high state (via the contacted primary area PL1). A signal representative of the high state of the primary line concerned then "penetrates" the first bus B1 and reaches the connecting pin PC of the microprocessor μP that corresponds to that primary line.

In this case, the microprocessor μP receives three high signals on three of its connecting pins PC. It informs its analysis module MA of this, which module is configured to deduce firstly from the two high signals coming from the two secondary lines L2-1 and L2-2 that one of the keys T of the secondary line L2-0 has been operated, and thus the identifier of the latter. Then, knowing the identifiers of the primary line L1-i and the secondary line L2-0, it accesses the memory MM to determine in the table therein the key identifier that is stored in corresponding relationship to the primary line identifier L1-i and the secondary line identifier L2-0. This identifies the key that has been operated and the associated command or function can then be executed.

The analysis module MA of the input keyboard CS of the invention may take the form of electronic circuits, software (or data processing) modules, or a combination of circuits and software.

In the keyboard example shown in FIG. 1, the input keys TE (associated with the primary line L1-3 and the secondary line L2-2), TO (associated with the primary line L1-1 and the secondary line L2-2), TN (associated with the primary line L1-2 and the secondary line L2-1), and TS (associated with the primary line L1-0 and the secondary line L2-1) are so-called "navigation" keys dedicated to commanding movement in the respective so-called "main" directions east, west, north and south. The input keys TNE (associated with the primary line L1-3 and the secondary line L2-0, TSE (associated with the primary line L1-1 and the secondary line L2-0), TNO (associated with the primary line L1-2 and the secondary line L2-0), and TSO (associated with the primary line L1-0 and the secondary line L2-0) are navigation keys dedicated to commanding movement in respective so-called "intermediate" directions north-east, south-east, north-west and south-west.

These keys are coupled to a navigation member such as a joystick, for example.

For example, if the TE key corresponding to the main direction east is operated:
- the primary line L1-3 goes to its high state with the result that a high signal "penetrates" the first bus B1 and reaches the corresponding connecting pin PC of the microprocessor μP, enabling it to be identified, and
- the secondary line L2-2 goes to its high state, whereas the secondary line L2-0 goes to its low state. The outputs S of the multiplexers M1 and M2 are therefore connected to their first inputs E1. Because only the secondary line L2-2 is in its high state, only the output S of the multiplexer M2 "delivers" over the second bus B2 a high signal that reaches the corresponding connecting pin PC of the microprocessor μP, thus enabling it to be identified.

Knowing the identifiers of L1-3 and L2-2, the analysis module MA deduces that it is the key TE that has been operated.

If the key TSE corresponding to the intermediate direction south-east is now operated:
- the primary line L1-1 goes to its high state with the result that a high signal "penetrates" the first bus B1 and reaches the corresponding connecting pin PC of the microprocessor μP, thus enabling it to be identified, and
- the secondary line L2-0 goes to its high state with the result that the outputs S of the multiplexers M1 and M2 are connected to their third inputs E3. The outputs S of the multiplexers M1 and M2 then each "deliver" over the second bus B2 a high signal that reaches the corresponding connecting pin PC of the microprocessor μP, thus enabling the secondary lines L2-1 and L2-2 to be identified.

Given the identifiers of the two secondary lines L2-1 and L2-2, the analysis module MA deduces that a key of the secondary line L2-0 has been operated, and thus deduces the identifier of the secondary line L2-0. Then, knowing the identifiers of the secondary lines L1-3 and L2-0, the analysis module MA deduces that it is the key TSE that has been operated.

If one of the keys T associated with one of the secondary lines L2-3 to L2-5 whose connecting terminals BC are connected "directly" to the second bus B2 is operated, the procedure for determining that key is conventional. To be more precise, operation of a key T places the primary line and the associated secondary line in the high state. Their connecting terminals BC then "deliver" over the first bus B1 and the second bus B2 high signals that reach the corresponding connecting pins PC of the microprocessor μP, thus enabling the primary and secondary lines to be identified. Knowing the identifiers of the primary and secondary lines, the analysis module MA can then deduce the identifier of the key TE that has been operated.

It is important to note that the connecting terminals BC of the secondary lines L2-j that are connected to the bus B2 through the intermediary of a multiplexer Mj are not necessarily identical to the connecting terminals BC of the secondary lines L2-j that are connected "directly" to the bus B2.

It is also important to note that the first bus B1 and the second bus B2 may constitute one and the same bus.

Thanks to the invention, it is therefore possible to add one or more input keys to a keyboard without this necessitating the addition of connecting pins to the microprocessor. Accordingly, in the present example, four intermediate navigation keys TNE, TNO, TSE and TSO have been added to the four main navigation keys TE, TO, TN and TS of the keyboard CS in order to offer four additional movement commands, for the same number of connecting pins as in a conventional keyboard (in the present example 10 connecting pins).

Figure 2:
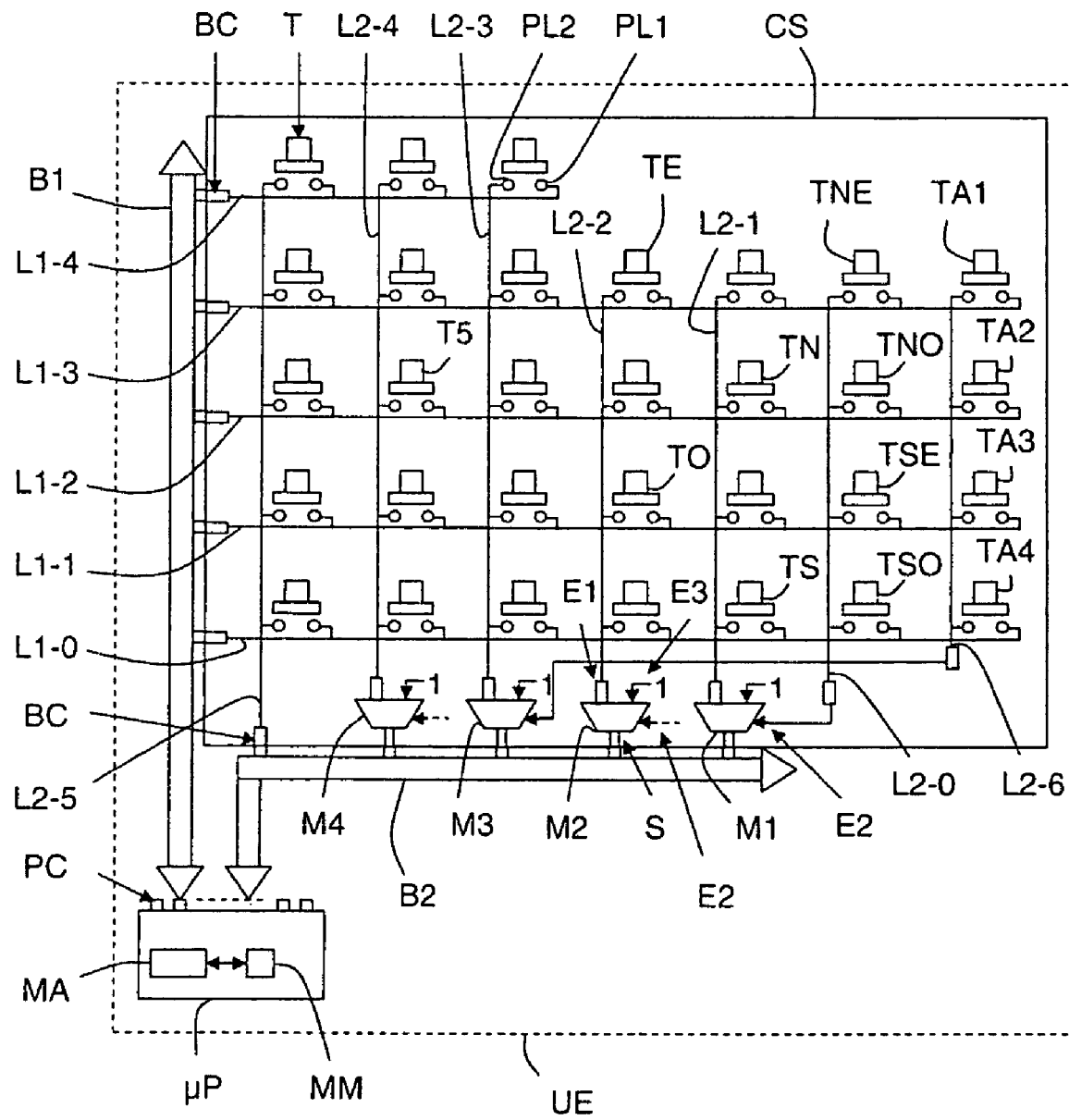
FIG. 2 is a diagram of a second embodiment of an input keyboard of the invention connected to an electronic device microprocessor.

A second embodiment of an input keyboard CS of the invention is described next with reference to FIG. 2. Strictly speaking, this is a variant of the first embodiment described above with reference to FIG. 1.

This second embodiment repeats the first embodiment in its entirety and additionally includes an additional secondary connecting line L2-6 connected to two additional multiplexers M3 and M4 respectively connected to the connecting terminals BC of the fourth secondary line L2-3 and the fifth secondary line L2-4.

The additional secondary connecting line L2-6 and the two additional multiplexers M3 and M4 enable four further additional keys TA1 to TA4 to be added to the FIG. 1 keyboard CS without increasing the number of connecting pins PC of the microprocessor μP. The additional secondary connecting line L2-6 and the two additional multiplexers M3 and M4 operate in the same manner as the secondary connecting line L2-0 and the two additional multiplexers M1 and M2.

For example, if the key T5 associated with the primary line L1-2 and the secondary line L2-4 is operated:
- the primary line L1-2 goes to its high state with the result that a high signal "penetrates" the first bus B1 and reaches the corresponding connecting pin PC of the microprocessor μP, thereby enabling it to be identified, and
- the secondary line L2-4 goes to its high state and the secondary line L2-6 goes to its low state. The outputs S of the multiplexers M3 and M4 are therefore connected to their first inputs E1. Because only the secondary line L2-4 is in its high state, only the output S of the multiplexer M4 "delivers" over the second bus B2 a high signal that reaches the corresponding connecting pin PC of the microprocessor µP, thereby enabling it to be identified.

Knowing the identifiers of L1-2 and L2-4, the analysis module MA deduces that it is the key T5 that has been operated.

If the key TA1 associated with the primary line L1-3 and the secondary line L2-6 is operated:

the primary line L1-3 goes to its high state with the result that a high signal "penetrates" the first bus B1 and reaches the corresponding connecting pin PC of the microprocessor µP, thereby enabling it to be identified, and the secondary line L2-6 goes to its high state with the result that the outputs S of the multiplexers M3 and M4 are connected to their third inputs E3. The outputs S of the multiplexers M3 and M4 then each "deliver" onto the second bus B2 a high signal that reaches the corresponding connecting pin PC of the microprocessor µP, thereby enabling the secondary lines L2-3 and L2-4 to be identified.

Given the identifiers of the secondary lines L2-3 and L2-4, the analysis module MA deduces that a key of the secondary line L2-6 has been operated, and therefore the identifier of L2-6. Then, knowing the identifiers of L1-3 and L2-6, the analysis module MA deduces that it is the key TA1 that has been operated.

The invention is not limited to the embodiments of an input keyboard and an electronic device described hereinabove by way of example only, but encompasses all variants thereof that the person skilled in the art might envisage that fall within the scope of the following claims.

Many configurations different from those described above may be envisaged, comprising a greater or lesser number of primary and/or secondary lines and a greater number of processing means connected to the secondary lines that are not connected "directly" to the bus (or to any other means of connection to the connecting pins of the microprocessor).

Generally speaking, the invention applies to any input keyboard having:

at least two primary conductive lines each connected to at least one primary connecting area and to one connecting terminal, at least first, second and third secondary conductive lines each connected to at least one secondary connecting area and to one connecting terminal, at least three input keys each able to establish, when operated, contact between a primary connecting area of one of the primary lines and a secondary connecting area of one of the secondary lines, in order to place each of those primary and secondary lines in a high state at its connecting terminal, and first and second processing means each including:

at least one first input connected to the connecting terminal of the first or second secondary line, a second input connected to the connecting terminal of the third secondary line, and an output that can be placed either in the same state as the first or second secondary line to which it is connected if the third secondary line is not in its high state or in the high state if the third secondary line is in its high state and is intended to be connected to a microprocessor of the device, like each connecting terminal of the primary lines, so that it can determine each key operated as a function of the respective states in which the primary lines and the outputs of the first and second processing means are placed.

Also, the invention is not limited to the processing means described above.

There is claimed:

1. An input keyboard for an electronic device including a microprocessor having a limited number of connecting pins, of the type comprising:

i) at least two primary conductive lines each connected to at least one primary connecting area and to one connecting terminal, each connecting terminal being adapted to be connected directly to a connecting pin of said microprocessor, ii) at least one first secondary conductive line, one second secondary conductive line and one third secondary conductive line each connected to at least one secondary connecting area and to one connecting terminal, iii) at least three input keys each adapted, when operated, to establish contact between a primary area of one of the primary lines and a secondary area of one of the secondary lines so that each of the primary and secondary lines is placed in a "high" state at its connecting terminal, which keyboard further comprises at least first processing means and second processing means each including at least:

one first input connected to the connecting terminal of the first secondary line or the second secondary line, respectively, one second input connected to the connecting terminal of the third secondary line, and one output adapted to be placed either in the same state as the first secondary line or the second secondary line, respectively, to which it is connected if the third secondary line is not in its high state, or in the high state if the third secondary line is in its high state, each output being adapted to be connected to one of the connecting pins of the microprocessor so that it can determine each key operated as a function of the respective states of, firstly, the primary lines and, secondly, the outputs of the first processing means and the second processing means.

2. The keyboard claimed in claim 1, wherein said first processing means and said second processing means each take the form of a multiplexer having a second input that is a command input and a third input that is permanently at a high state and is adapted to be connected to the output if said third secondary line is in its high state, said first input being coupled to said output if said third secondary line is not in its high state.

3. The keyboard claimed in claim 1, further comprising at least four primary conductive lines each connected to a selected number of primary connecting areas and to a connecting terminal adapted to be connected to said microprocessor and at least one fourth secondary conductive line, one fifth secondary conductive line and one sixth secondary conductive line each connected to a selected number of secondary connecting areas and to a connecting terminal adapted to be connected to said microprocessor.

4. The keyboard claimed in claim 3, wherein each primary line is connected to at least six primary areas associated with six input keys and each of said secondary lines is connected to at least four secondary areas.

5. The keyboard claimed in claim 3, wherein said first secondary line and two of said primary lines are associated with two "navigation" keys themselves associated with two "main" directions and said second secondary line and two other primary lines are associated with two other navigation keys, themselves associated with two other main directions.

6. The keyboard claimed in claim 5, wherein said third secondary line and four of said primary lines are associated with four other navigation keys themselves associated with four "intermediate" directions respectively consisting of different pairs of main directions.

7. The keyboard claimed in claim 3, wherein at least one of said primary lines is connected to at least one additional primary area associated with an additional input key and in that it comprises:

i) at least one seventh secondary line connected to at least one additional secondary area associated with said additional key and with a connecting terminal and third processing means and fourth processing means each comprising at least one first input connected to the connecting terminal of the fourth secondary line or the fifth secondary line, one second input connected to the connecting terminal of the seventh secondary line, and one output adapted to be placed either in the same state as the fourth secondary line or the fifth secondary line to which it is connected if the seventh secondary line is not in its high state or in the high state if the seventh secondary line is in its high state and adapted to be connected to said microprocessor so that it can determine each key operated associated with said seventh secondary line as a function of the respective states of the primary lines and the outputs of the third processing means and the fourth processing means.

8. The keyboard claimed in claim 7, wherein said third processing means and said fourth processing means each take the form of a multiplexer having a second input that is a command input and a third input that is permanently in a high state and is adapted to be connected to the output if said seventh secondary line is in its high state, said first input being coupled to said output if said seventh secondary line is not in its high state.

9. The keyboard claimed in claim 3, wherein it comprises at least one additional primary line connected to at least three primary areas associated with three other input keys and with three secondary areas connected to said fourth secondary conductive line, said fifth secondary conductive line and said sixth secondary conductive line.

10. An electronic device comprising at least one microprocessor and an input keyboard as claimed in any one of claims 1 to 9 connected to said microprocessor.

11. The device claimed in claim 10, further comprising analysis means adapted to analyze the states of the primary lines and the outputs of said first processing means and/or said second processing means of said keyboard and to deduce that an operated key is associated either with the first secondary line, respectively the second secondary line, if a primary line is in its high state and the output of said first processing means, respectively second processing means, is in its high state, or to the third secondary line if a primary line is in its high state and the outputs of said first processing means and said second processing means are in their high state.

12. The device claimed in claim 11, further comprising storage means adapted to store a table establishing a correspondence between key identifiers, primary line identifiers and secondary line identifiers and wherein said analysis means are adapted to access said storage means to determine in said table a key identifier corresponding to analyzed line states.

13. The device claimed in claim 11, selected from a group comprising at least fixed or mobile telephones, personal digital assistants, fixed or portable computers and games consoles.

* * * * *